US006878955B2

(12) United States Patent
Harris et al.

(10) Patent No.: US 6,878,955 B2
(45) Date of Patent: Apr. 12, 2005

(54) METHOD AND APPARATUS FOR ACCESSING MICROELECTRONIC WORKPIECE CONTAINERS

(75) Inventors: Randy Harris, Kalispell, MT (US); Kyle M. Hanson, Kalispell, MT (US); Daniel P. Bexten, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/756,049

(22) Filed: Jan. 12, 2004

(65) Prior Publication Data

US 2004/0140442 A1 Jul. 22, 2004

Related U.S. Application Data

(62) Division of application No. 09/875,439, filed on Jun. 5, 2001, now Pat. No. 6,717,171.

(51) Int. Cl.[7] ............................................. B65G 49/07
(52) U.S. Cl. ............................ 250/559.33; 250/559.29; 414/938; 414/941
(58) Field of Search ....................... 250/559.04, 559.29, 250/559.32, 559.33, 559.36, 599.4, 221; 414/217, 217.1, 416.03, 935, 936, 937, 938, 941

(56) References Cited

U.S. PATENT DOCUMENTS

| | | | |
|---|---|---|---|
| 5,772,386 A | 6/1998 | Mages et al. | |
| 5,947,718 A | 9/1999 | Weaver | |
| 6,030,208 A | 2/2000 | Williams et al. | |
| 6,042,324 A | 3/2000 | Aggarwal et al. | |
| 6,071,059 A | 6/2000 | Mages et al. | |
| 6,168,695 B1 | 1/2001 | Woodruff et al. | |
| 6,188,323 B1 | 2/2001 | Rosenquist et al. | |
| 6,318,951 B1 | 11/2001 | Schmidt et al. | |
| 6,413,356 B1 | 7/2002 | Chokshi et al. | |
| 6,642,533 B2 * | 11/2003 | Haraguchi et al. | 250/559.33 |

2002/0006322 A1  1/2002  Perlov et al.

OTHER PUBLICATIONS

U.S. Appl. No. 09/114,105, filed Jul. 11, 1998, Woodruff et al.
SMIF–INX 2150/220/R150, http://www.asyst.com/prod/smif/smit_INX.html; 1 pg, © 2001 Asyst Technologies, accessed Mar. 26, 2001.
SEMITOOL, INC., VTP 1500 Vertical Furnace Brochure, 1994, 1 pg.

* cited by examiner

*Primary Examiner*—Kevin Pyo
(74) *Attorney, Agent, or Firm*—Perkins Coie LLP

(57) ABSTRACT

An apparatus and method for handling microelectronic workpieces initially positioned in a container. The container can be changeable from a first configuration where the microelectronic workpiece is generally inaccessible within the container to a second configuration where the microelectronic workpiece is accessible for removal from the container. The apparatus can include a container access device positionable proximate to an aperture of an enclosure that at least partially encloses a region for handling a microelectronic workpiece. The container access device can be movably positioned proximate to the aperture to change the configuration of the container from the first configuration to the second configuration. A container support can be positioned proximate to the aperture and can be configured to move the container to a fixed, stationary position relative to the aperture when the container is in the second configuration. Accordingly, the microelectronic workpieces within the container can be less likely to be damaged by movement of the container. Instead, a workpiece transfer device can be configured to have a range of travel that allows it to access each of the microelectronic workpieces within the container without requiring that the container itself be moved. A workpiece detector coupled to the container access device can move generally parallel to the microelectronic workpieces to detect a presence, absence, and/or position of the microelectronic workpieces, without moving laterally toward and away from the microelectronic workpieces.

24 Claims, 9 Drawing Sheets

METHOD AND APPARATUS FOR ACCESSING MICROELECTRONIC WORKPIECE CONTAINERS

CROSS-REFERENCE TO RELATED APPLICATION

This application is a divisional of U.S. application Ser. No. 09/875,439 filed Jun. 5, 2001 now U.S. Pat No. 6,717,171.

TECHNICAL FIELD

The present invention is directed toward methods and apparatuses for accessing microelectronic workpiece containers, such as FOUP containers.

BACKGROUND

Microelectronic devices, such as semiconductor devices and field emission displays, are typically fabricated on and/or in microelectronic workpieces using several different types of process machines ("tools"). A workpiece, for example, is often processed using tools for depositing, implanting, diffusing, doping, etching, polishing/planarizing, and patterning materials. A workpiece can typically undergo several processing steps within a single enclosed clean or "mini" environment within a processing tool. For example, microelectronic workpieces can be plated with a conductive material, annealed, etched, and cleaned, using a plurality of processing chambers all housed within a single processing enclosure that defines a clean mini environment.

These processes can be performed on each workpiece individually in separate single-wafer processing chambers, and the workpieces can be moved from one processing chamber to the next, a technique referred to in the industry as single wafer processing. One initial problem encountered with single wafer processing was determining how to deliver individual workpieces to and from the enclosure while maintaining a clean environment within the enclosure. One approach to addressing this problem has been to load several workpieces in a portable container while the container is in a clean environment and then seal the container with a removable door. Accordingly, the interior of the container can define another clean mini environment. The door is then removed when the container is flush with a hatch of the processing enclosure to reduce the likelihood for introducing contaminants into the enclosure.

One conventional container having the foregoing design is a Front Opening Unified Pod (FOUP). In operation, the door of the container is positioned flush against the hatch of the processing enclosure to reduce or eliminate any non-clean gas volume between the door and the hatch, and the door and the hatch are then moved together into the enclosure, allowing access between the interior of the container and the interior of the processing enclosure. A robot then retrieves individual microelectronic workpieces from the container, delivers them to the appropriate processing stations, and returns them to the container after they have been processed. Once the container has been refilled with processed microelectronic workpieces, the removable door is put back in place and the container is moved away from the enclosure.

To improve the efficiency of the foregoing operation, it may be desirable to place a relatively large number of microelectronic workpieces in a single container. It may also be desirable to increase the size of the microelectronic workpieces. Accordingly, the container can become quite heavy when fully loaded with microelectronic workpieces, making the container difficult to handle.

One known approach to addressing the foregoing problem (shown schematically in FIGS. 1A–B) is to provide a processing enclosure 10 with a container intake section 12 that allows containers 13 to be loaded at an ergonomically suitable height. The container 13 is translated horizontally at the intake section 12 (as indicated by arrow "T" in FIG. 1A) to align a removable door 16 of the container with a door remover of the enclosure 10. The door remover 18 can include a panel positioned in an aperture of a movable frame 14. The door remover 18 engages the door 16 and moves it horizontally into the enclosure, as indicated by arrow "U." Referring to FIG. 1B, the frame 14 and the container 13 move upwardly together on an elevator 20 (as indicated by arrow "V") to align the open container 13 with a robot 19. The elevator 20 then indexes the container 13 upwardly and downwardly (as indicated by arrow "W") to align each microelectronic workpiece in the container 13 with the robot 19. The robot 19 transfers each workpiece to one or more processing chambers 21 for processing, and then returns each workpiece to the container 13.

One drawback with the approach shown in FIGS. 1A–B is that moving the container 13 up and down to align the workpieces with the robot 19 can cause the workpieces to shift within the container 13. As the workpieces shift, they can be damaged, or the workpieces can become misaligned relative to the robot 19. The robot 19 may then be unable to retrieve the workpieces from the container 13.

Another problem associated with moving microelectronic workpieces into and out of a container has been determining which positions within the container are occupied by workpieces, and whether the workpieces in the occupied positions are properly seated. One approach to addressing this problem, disclosed in U.S. Pat. No. 6,188,323 to Rosenquist et al., is to mount a scanning device on a door opener that opens the door of the container. The door opener operates by engaging the door of the container and retracting the door horizontally into the enclosure and then downwardly away from the container. As the door opener moves downwardly with the door, the scanner moves past the workpieces in the open container and scans the workpieces with a beam of light. However, this arrangement may not provide for consistent scanning results and, in some cases, the scanner can mistakenly indicate workpieces in unoccupied positions, and/or mistakenly indicate no workpieces in occupied positions.

SUMMARY

The present invention is directed toward methods and apparatuses for handling microelectronic workpieces initially positioned within a container. The container can be changeable from a first configuration with the microelectronic workpieces generally inaccessible within the container, to a second configuration with the microelectronic workpieces accessible for removal from the container. Several embodiments of the apparatus comprise a movable container support that positions the container next to an aperture of a workpiece processing tool, and then remains in a fixed, stationary position while the microelectronic workpieces are moved from the container into the tool and back again. An advantage of this feature is that microelectronic workpieces can be less likely to shift in the container because the container can remain in a fixed position while it is being accessed. Instead, a movable robot can index a sufficient amount to access each microelectronic workpiece within the container without moving the container itself.

Another feature of several embodiments of the apparatus is a scanner that scans the positions of the microelectronic workpieces (for example, with a focused beam of light) as the container is changed from the first configuration to the second configuration. The scanner can be mounted to a portion of the apparatus that does not move toward or away from the microelectronic workpieces. An advantage of this feature is that the scan be more accurate than some conventional scans because the focal point of the scanning beam has a consistent location relative to the microelectronic workpieces.

In one aspect of the invention, the apparatus can include a container access device positionable proximate to an aperture of an enclosure that at least partially encloses a region for handling the microelectronic workpiece. The container access device can be movable to change the configuration of the container from the first configuration to the second configuration. The apparatus can further include a container support movably positioned proximate to the aperture, with an actuator coupled to the container support to move the container support between a first position at a first height and a second position at a second height different than the first height. The container support can be configured to support the container in a fixed, stationary position relative to the aperture when the container is in the second configuration and positioned to have the microelectronic workpiece removed. For example, the container support can include an elongated pin received in a corresponding opening of the enclosure to at least restrict motion of the container support.

In a further aspect of the invention, the container can have a plurality of workpiece support members, each configured to support a microelectronic workpiece. The workpiece support members can include a first workpiece support member and a second workpiece support member with the second workpiece support member positioned further than any of the other workpiece support members from the first workpiece support member. The apparatus can further include a workpiece transfer device having an engaging portion configured to releasably engage the microelectronic workpieces. The workpiece transfer device can be movable relative to the housing to move the microelectronic workpieces, and can have a range of travel that extends from a first position aligned with the first workpiece support member of the container to a second position aligned with the second workpiece support member of the container.

In yet another aspect of the invention, the microelectronic workpieces can be spaced apart along a first axis, and the container access device can have a movable portion movable relative to the aperture along a second axis at least approximately parallel to the first axis to change the configuration of the container from the first configuration to the second configuration. The apparatus can further include a workpiece detector operatively coupled to the movable portion of the container access device to move with the movable portion along a third axis at least approximately parallel to the second axis, but not toward or away from the second axis. The workpiece detector can be configured to detect a presence, absence, and/or position of a microelectronic workpiece in the container.

The invention is also directed toward a method for handling microelectronic workpieces. In one embodiment, the method can include positioning a container on a container support external to an enclosure at least partially surrounding a region for handling a microelectronic workpiece. The container can have a plurality of microelectronic workpieces and the method can further include elevating the container and the container support from a first position to a second position above the first position, and changing a configuration of the container from a first configuration with the microelectronic workpieces generally inaccessible within the container to a second configuration with microelectronic workpieces accessible for removal from the container. The method can further include securing the container to be fixed relative to the enclosure when the container is in the second position (for example, by engaging a pin of the container support with an aperture of the enclosure), and moving the plurality of microelectronic workpieces from the container through an aperture into the enclosure while the container remains in the fixed position relative to the enclosure.

In one aspect of this method, the container can include an opening with a cover removably positioned at least proximate to the opening and changing the configuration of the container can include moving the cover from an attached position to a detached position. In another aspect of this method, the container can include a plurality of microelectronic workpieces spaced apart along an axis. The microelectronic workpieces can include a first microelectronic workpiece and a second microelectronic workpiece with the second microelectronic workpiece positioned further than any of the microelectronic workpieces from the first microelectronic workpiece. The method can include aligning a workpiece transfer device with the first microelectronic workpiece and engaging the workpiece transfer device with the first microelectronic workpiece to remove the first microelectronic workpiece. The method can further include moving the workpiece transfer device to align the workpiece transfer device with the second microelectronic workpiece, and removing the second microelectronic workpiece from the container.

In another aspect of the invention, the method can include positioning a container proximate to an aperture at least partially enclosing a region for handling a microelectronic workpiece, with the container having a plurality of microelectronic workpieces spaced apart along a first axis. The method can further include changing a configuration of the container from a first configuration with the microelectronic workpieces generally inaccessible within the container to a second configuration with the microelectronic workpieces accessible for removal from the container by engaging a container access device with the container and moving a movable portion of the container access device along a second axis at least approximately parallel to the first axis. The method can still further include detecting a presence, absence, and/or position of microelectronic workpieces in the container by moving a workpiece detector together with a movable portion of the container access device as the movable portion moves along the second axis and without moving the workpiece detector toward or away from the first axis.

DETAILED DESCRIPTION

The following disclosure describes methods and apparatuses for accessing and handling microelectronic workpieces, such as semiconductor wafers, that are initially positioned in an enclosed container. Many specific details of certain embodiments of the invention are set forth in the following description and in FIGS. 2–11 to provide a thorough understanding of these embodiments. One skilled in the art, however, will understand that the present invention may have additional embodiments, or that the invention may be practiced without several of the details described below.

Figure 1A:
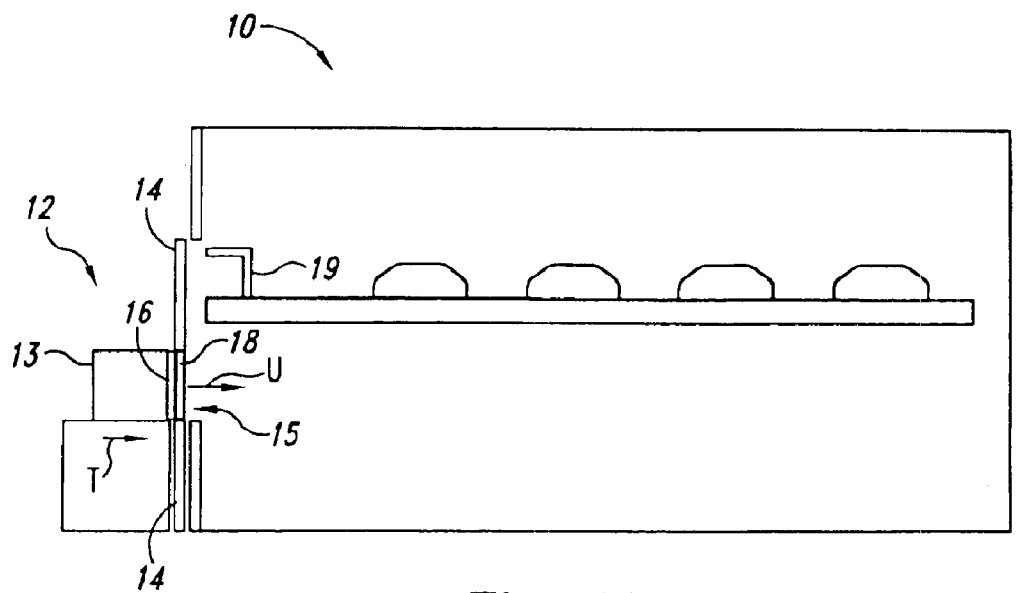
FIGS. 1A–B are partially schematic illustrations of a device configured to load and unload wafers in accordance with the prior art.
Figure 1B:
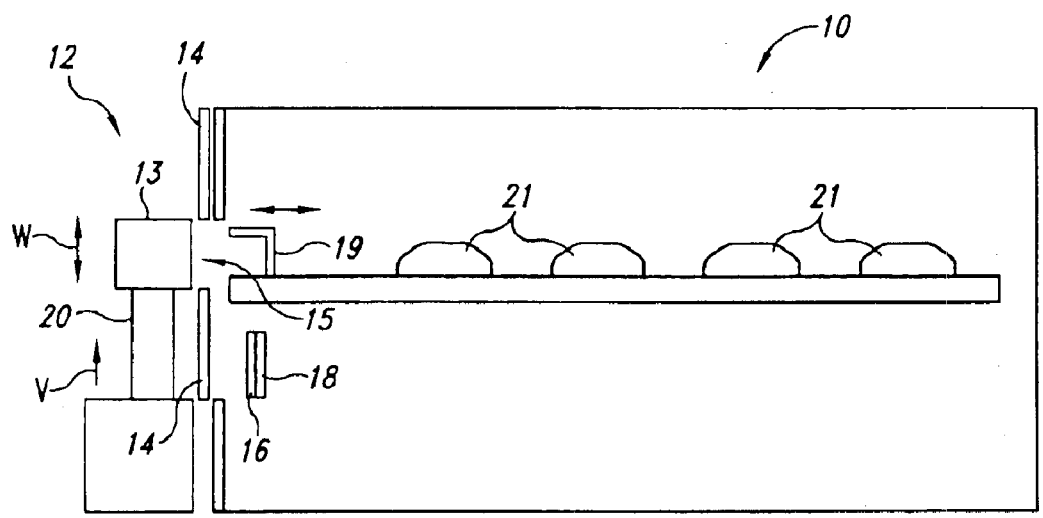
Figure 2:
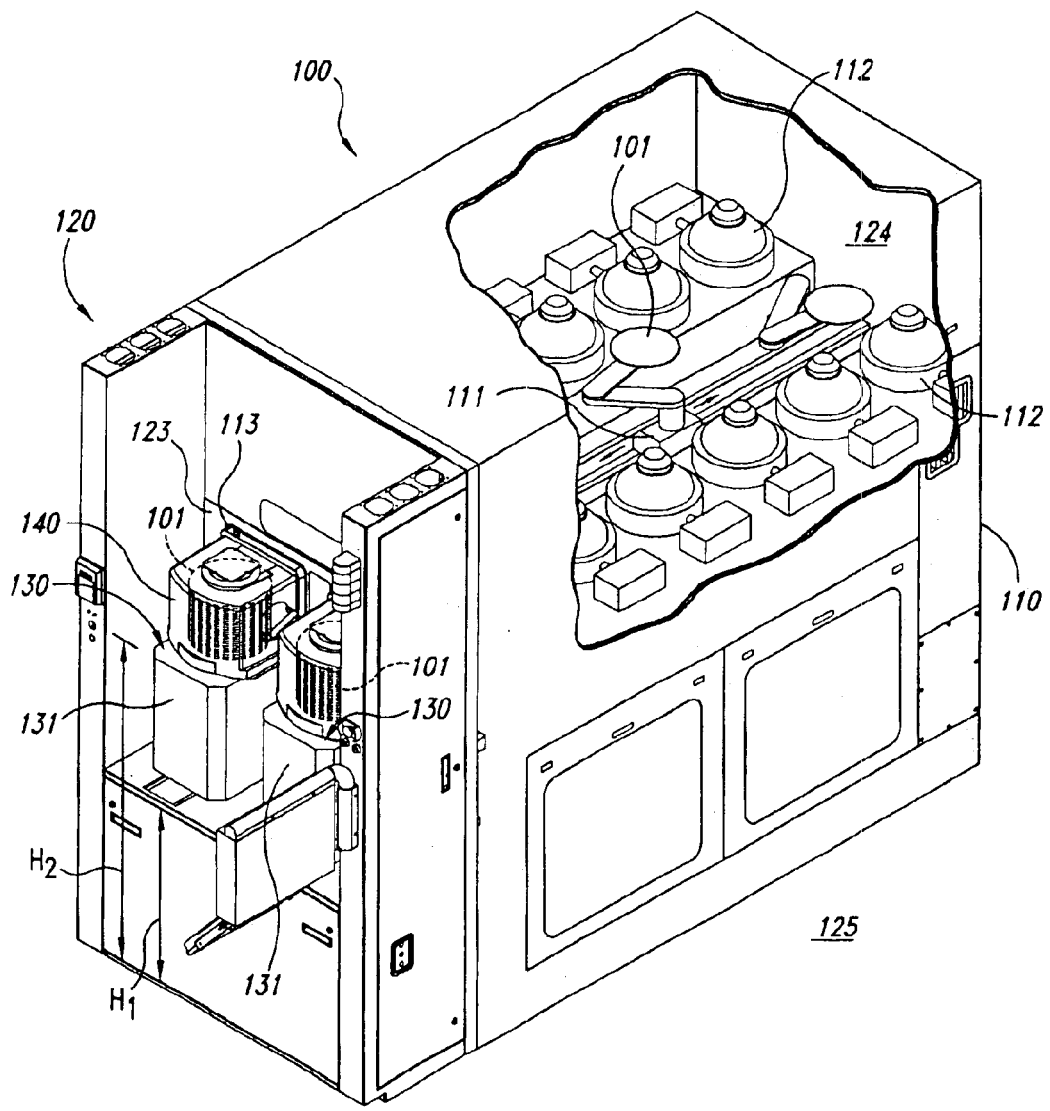
FIG. 2 is a partially broken isometric view of an apparatus in accordance with an embodiment of the invention showing selected components schematically.

FIG. 2 illustrates apparatus 100 in accordance with an embodiment of the invention. In one aspect of this embodiment, the apparatus 100 can include a workpiece loader 120 having two container supports 130, each housed in a protective shroud 131 and configured to position a workpiece container 140 relative to a housing 110. The workpiece loader 120 and the housing 110 together define an enclosure that at least partially isolates an interior region 124 (that can be maintained at clean room standards) from an exterior region 125. The workpiece container 140 can house a plurality of microelectronic workpieces 101 in a "mini" clean room environment that is accessible from the interior region 124 of the housing 110 through an aperture 113 (shown closed in FIG. 2) in a panel 123 of the workpiece loader 120. Accordingly, a workpiece transfer device 111 can move the microelectronic workpieces 101 into and out of the housing 110, as described in greater detail below.

The housing 110 can include a plurality of processing stations 112, such as an electrolytic or electroless processing chamber (for plating, anodizing, electropolishing, and/or electrodepositing materials), an etching chamber, a clean chamber, a photoresist strip chamber, a photoresist develop chamber, a spin-rinse-dry chamber, a metrology chamber, and/or an anneal chamber. In other embodiments, the housing 110 can include other types of processing chambers. In any of these embodiments, the workpiece transfer device 111 can engage the microelectronic workpieces 101 in the container 140, move the microelectronic workpieces 101 from the container 140 into the housing 110 through the aperture 113, then from one processing station 112 to another, and then back into the container 140.

The workpiece containers 140 are moved into position by the workpiece loader 120. In one embodiment, the workpiece loader 120 can be configured to support two containers 140 simultaneously. In other embodiments, the workpiece loader 120 can be configured to support more or fewer containers 140. In any of these embodiments, the container supports 130 of the workpiece loader 120 can elevate each container 140 from an ergonomic loading/unloading height $H_1$ to a workpiece access height $H_2$ at which the workpiece transfer device 111 can access the microelectronic workpieces 101 within the container 140.

Figure 3:
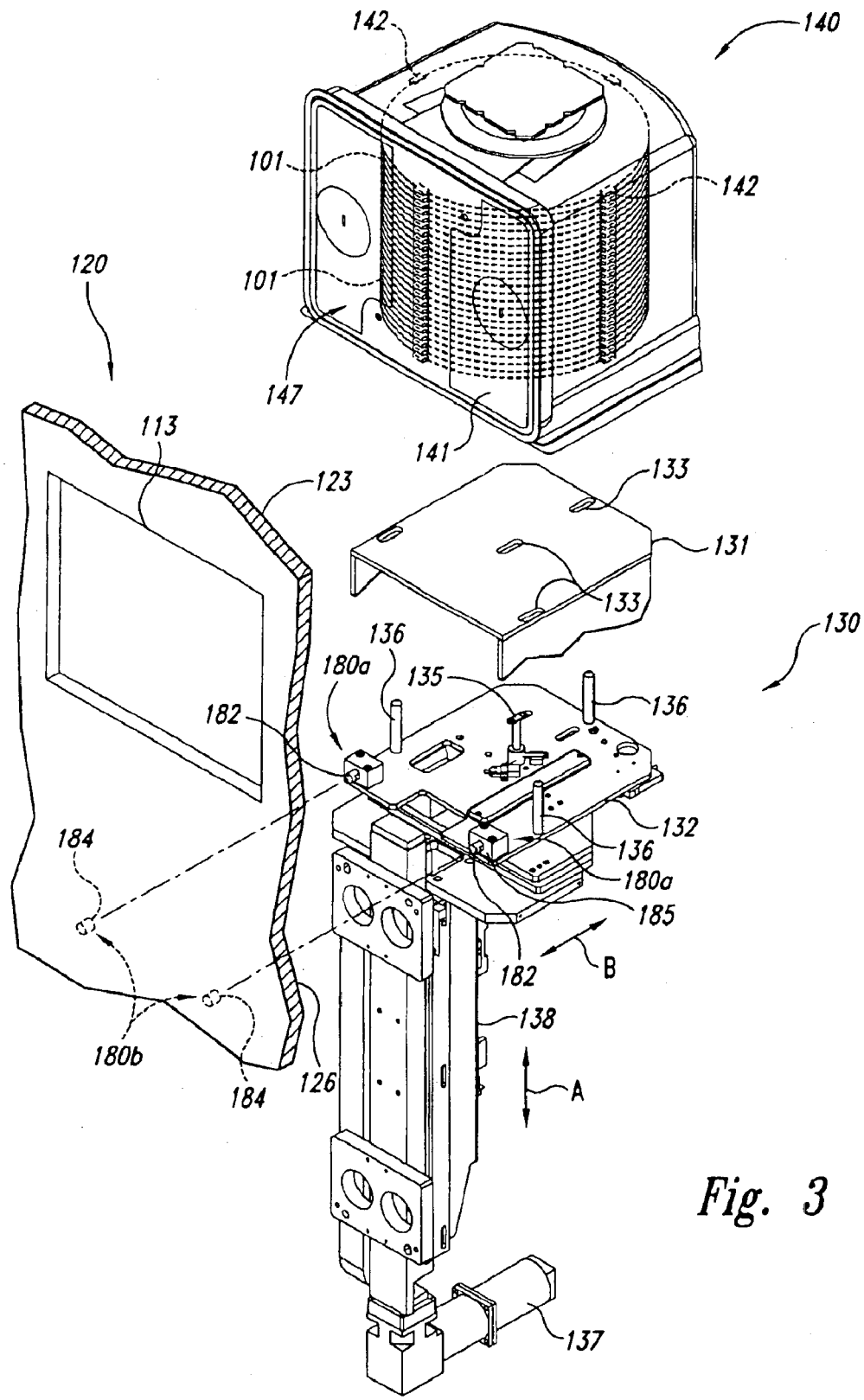
FIG. 3 is an isometric view of a container support for supporting a microelectronic workpiece container in accordance with an embodiment of the invention showing selected assemblies in an exploded arrangement.

FIG. 3 shows an embodiment of the container support 130 and a portion of the panel 123 positioned adjacent to the container 140. The surface of the panel 123 shown in FIG. 3 faces the interior region 124 of the housing 110. In one aspect of this embodiment, the container 140 can include a FOUP (Front Opening Unified Pod) device. Accordingly, the container 140 can conform with standards set forth by SEMATECH, or with other semiconductor industry standards. Alternatively, the container 140 can be a non-standard device. In either embodiment, the container 140 can be configured to house a stack of vertically spaced apart microelectronic workpieces 101, each supported in an approximately horizontal position on at least one support member 142. The container 140 can include an access portion 147 configured to initially seal the microelectronic workpieces 101 in the container 140. The container 140 and the access portion 147 can be changeable from a first configuration with the microelectronic workpieces 101 inaccessible within the container 140 to a second configuration with the microelectronic workpieces 101 accessible for removal from the container 140. For example, the access portion 147 can include a cover or door 141 that is completely removable from the container 140 for access. Alternatively, the access portion 147 can include a cover 141 that moves relative to the container 140, but remains attached to the container 140, even when the container 140 and access portion 147 are in the second configuration.

The container support 130 can be configured to (a) support the container 140, (b) elevate and lower the container 140 as indicated by arrow "A," and (c) translate the container 140 laterally as indicated by arrow "B" toward and away from the aperture 113. In one embodiment, the container support 130 can include a support platform 132 positioned within the shroud 131 and configured to support the container 140 from below. In a specific aspect of this embodiment, the support platform 132 can include support pins 136 and a latch pin 135 that project upwardly through slots 133 in the shroud 131. The support pins 136 can be received in corresponding pin apertures in the lower surface of the container 140 (not visible in FIG. 2). The latch pin 135 is rotatable to engage a corresponding latch on the lower surface of the container 140 and retain the container 140 in engagement with the support pins 136.

The support platform 132 can be coupled to a vertical drive motor 137, for example, with a lead screw and linear bearing or bushing positioned in a lead screw housing 138, to move the support platform 132 upwardly and downwardly as indicated by arrow A. In alternative embodiments, the container support 130 can include other linear actuation mechanisms to elevate and lower the support platform 132. The support platform 132 can be coupled to a lateral motion actuator (not visible in FIG. 3), such as a pneumatic actuator, an electric actuator, a worm drive, or another linear actuator device to move the container 140 toward and away from the aperture 113 as indicated by arrow B. In any of these embodiments, the container support 130 can position the container 140 adjacent to the aperture 113 and at least partially sealed against the panel 123 to allow access to the microelectronic workpieces 101 while limiting the exposure of the microelectronic workpieces 101 to contaminants by restricting the passage of non-clean gas in the region adjacent to the workpieces 101.

In a further aspect of this embodiment, the support platform 132 can include two first engagement members 180a that releasably engage corresponding second engagement members 180b of the workpiece loader 120 to securely support the container 140 against the outer surface of the panel 123. The first engagement member 180a can include a pin 182 and the second engagement member 180b can include an aperture 184 that receives the pin 182 when the support platform 132 translates laterally toward the workpiece loader 120. Alternatively, the relative positions of the first and second engagement members (collectively referred to as engagement members 180) can be reversed, as described below with reference to FIG. 11. In still further embodiments, the engagement members 180 have other configurations for releasably securing the support platform 132 relative to the aperture 113.

One feature of the engagement members 180 is that they can register the support platform 132 and the workpiece container 140 relative to the aperture 113. Accordingly, standard workpiece containers 140 can be consistently positioned at the same vertical location relative to the aperture 113. Another advantage of this arrangement is that the engagement members 180 can secure the container 140 in the vertical direction so that the workpiece container 140 need not move vertically to align the microelectronic workpieces 101 with the workpiece transfer device 111 (FIG. 2), as will be described in greater detail below with reference to FIG. 6. Still another advantage of this feature is that the engagement members 180 can secure the container 140 in a fixed position relative to the aperture 113 even if power to the vertical drive motor 137 fails.

In one embodiment, the engagement members 180a and 180b can move into engagement with each other only when the container 140 is vertically aligned with the aperture 113. In a further aspect of this embodiment, the support platform 132 and/or the panel 123 can include a sensor and/or lockout device operatively coupled to a container access device (described below with reference to FIG. 4 that accesses the container 140). The sensor and/or lockout device can prevent the container access device from moving to access the container 140 until the container 140 is in the proper vertical alignment with the aperture 113, and the engagement members 180a and 180b are engaged with each other. An advantage of this feature is that the engagement members 180a and 180b can be positioned to deactivate the lockout device and allow the container access device to access the container 140 only when the container 140 is properly aligned with the aperture 113.

Another feature of this arrangement is that a forward-facing engaging surface 185 of the first engagement member 180a can engage and register with a front surface 126 of the panel 123. Accordingly, the first engagement member 180a (and not the container 140) can absorb any stress that may result if the support platform 132 is driven too far laterally toward the front surface 126. An advantage of this feature is that the workpiece container 140 can be more likely to remain flush against the front surface 126, which can improve the seal between the container 140 and the panel 123.

Figure 4:
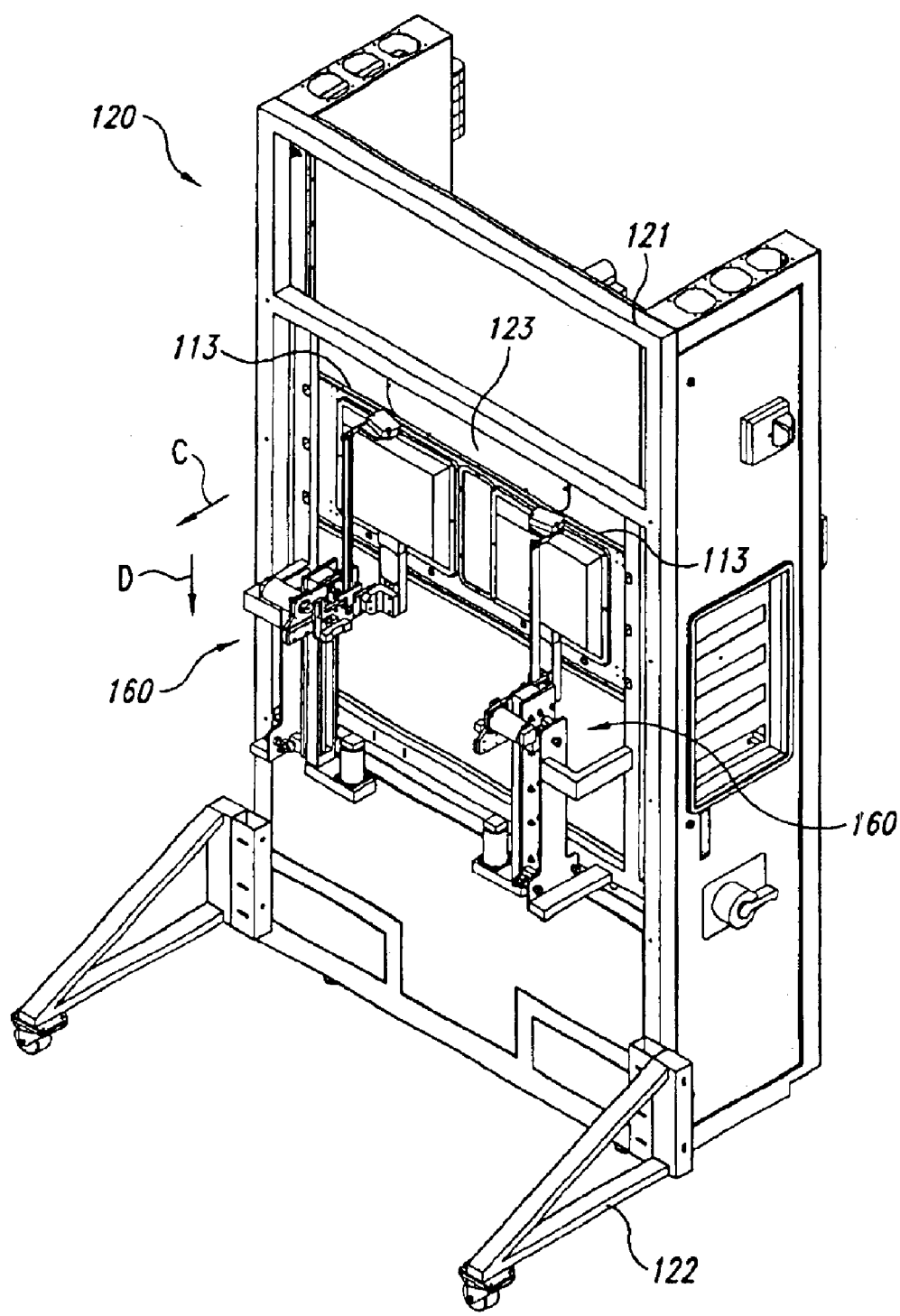
FIG. 4 is a rear isometric view of a workpiece loader in accordance with an embodiment of the invention showing selected components schematically.

FIG. 4 illustrates an embodiment of the workpiece loader 120 described above with reference to FIGS. 2 and 3. In one aspect of this embodiment, the workpiece loader 120 can include a frame 121 on roller supports 122. Accordingly, the workpiece loader 120 can be a modular unit, configured to integrate with a variety of housings 110. The frame 121 can support the panel 123 in which the apertures 113 are positioned. The workpiece loader 120 can also support a container access device 160 proximate to each aperture 113. The container access device 160 can be configured to change the configuration of the container 140 (FIG. 3) from the first configuration (with the microelectronic workpieces 101 generally inaccessible) to the second configuration (with the microelectronic workpieces 101 accessible for removal from the container). Accordingly, in one aspect of this embodiment, the container access device 160 can engage the cover 141 (FIG. 3) of the container 140 and move it laterally as indicated by arrow "C" and vertically as indicated by arrow "D" to move the cover 141 away from the aperture 113. Further details of this operation are described below with reference to FIG. 5.

Figure 5:
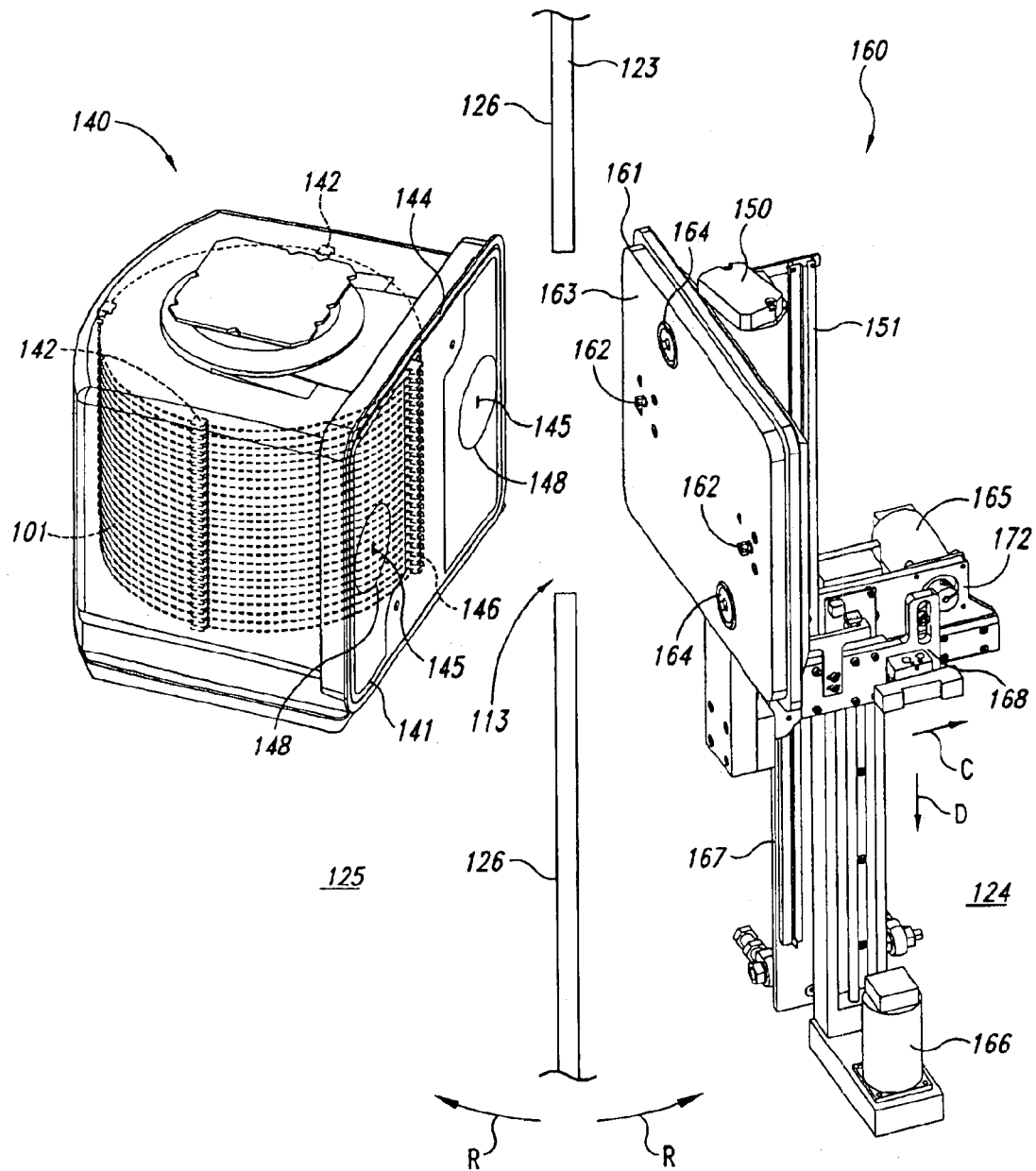
FIG. 5 is an isometric view of a container access device for accessing a microelectronic workpiece container in accordance with an embodiment of the invention showing selected components schematically.

FIG. 5 shows an embodiment of the panel 123, the container access device 160, and the container 140 described above. For purposes of illustration, the container access device 160 and the container 140 have been rotated slightly away from the panel 123 as indicated by arrows "R". The container 140 can include a rim 144 that at least partially seals against the front surface 126 of the panel 123 around the aperture 113. In one embodiment, the pressure in the interior region 124 on one side of the panel 123 is maintained above the pressure in the exterior region 125 on the other side of the panel 123 to reduce the likelihood for contaminants to enter the interior region 124. Accordingly, the seal between the container 140 and the panel 123 can be less than airtight.

The cover 141 of the container 140 can include one or more workpiece biasing devices 146 that engage the microelectronic workpieces 101 to prevent or at least restrict motion of the microelectronic workpieces 101 within the container 140. Accordingly, the microelectronic workpieces 101 will be less likely to be damaged when the container 140 is moved. The cover 141 can also include latches 148 that releasably secure the cover 141 to the container 140. The latches 148 can include latch apertures 145 configured to accept a key of the container access device 160 for releasing the cover 141.

The container access device 160 can include a door engaging panel 161 having a panel face 163 configured to engage the cover 141 of the container 140 in surface-to-surface contact. The door engaging panel 161 can also include keys 162 configured to engage the latch apertures 145 of the latches 148 in the cover 141 to release the cover 141 from the container 140. Suction cups 164 in the door engaging panel 161 can releasably secure the door engaging panel 161 to the cover 141 for moving the door 141 away from the container 140.

In one embodiment, door engaging panel 161 is connected to a lateral support arm 168. The lateral support arm 168 is driven laterally by a lateral motion motor 165 to move the door engaging panel inwardly as indicated by arrow C.

The lateral motion motor 165 can be positioned on a motor support arm 172 that moves only in a vertical direction. Accordingly, the motor support arm 172 can be coupled to a vertical motion motor 166 with a lead screw and linear bearing positioned in a lead screw housing 167. The vertical motion motor 166 can move the motor support arm 172, the lateral support arm 168, the door engaging panel 161, and the cover 141 downwardly, as indicated by arrow D. Accordingly, the container access device 160 can pull the cover 141 inwardly into the interior region 124 and downwardly away from the aperture 113 to allow access to the microelectronic workpieces 101 within the container 140, as will be described in greater detail below with reference to FIG. 6. The cover 141 can be replaced on the container 140 by reversing the motions of the vertical motion motor 166 and the lateral motion motor 165 described above.

Figure 6:
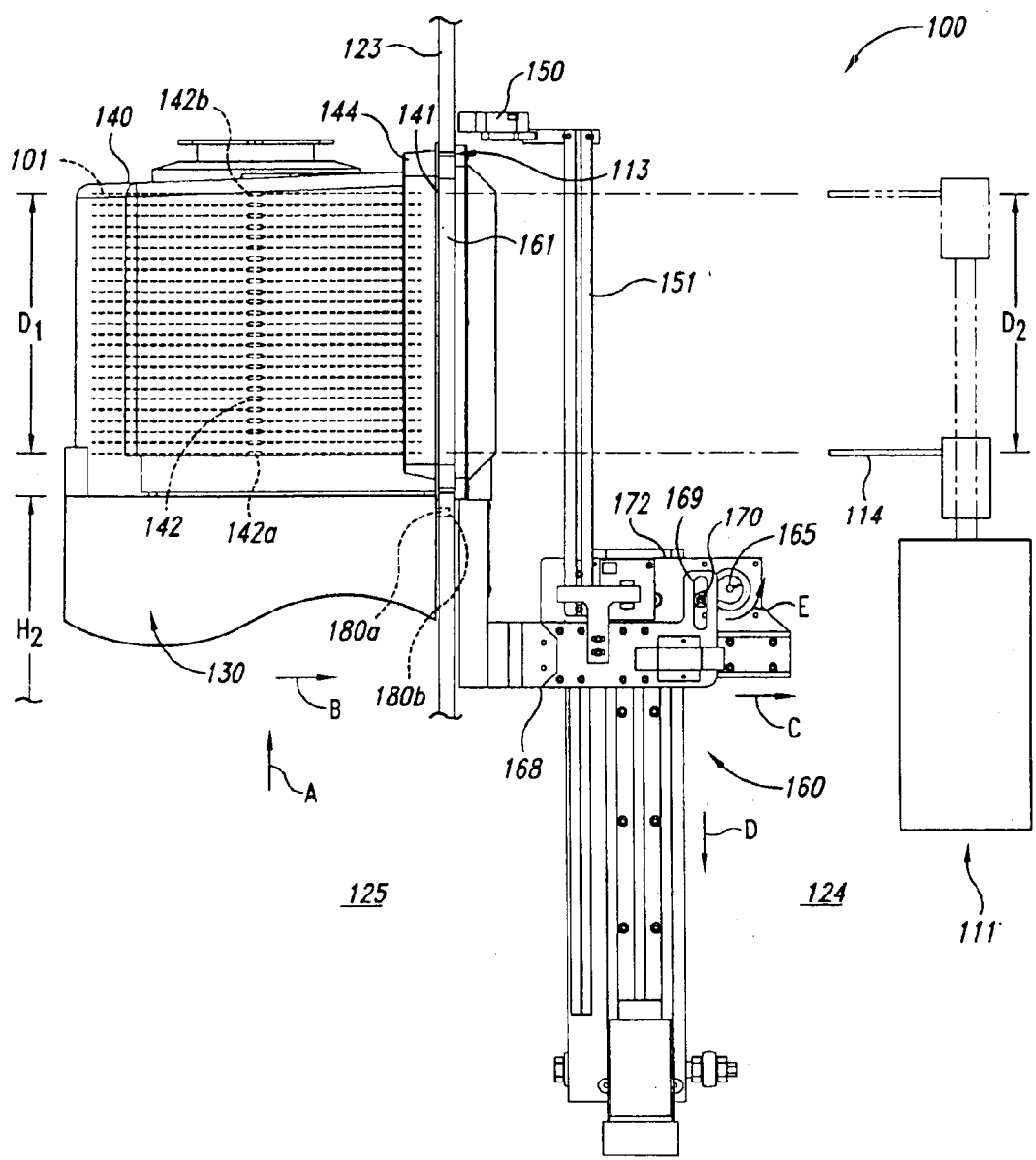
FIG. 6 is a side elevational view of a container access device and workpiece transfer device in accordance with an embodiment of the invention showing selected components schematically.

FIG. 6 illustrates a portion of the apparatus 100 in accordance with an embodiment of the present invention. In operation, the container 140 is positioned on the container support 130 and elevated (arrow A) to align the cover 141 of the container 140 with the aperture 113. The container support 130 then moves the container 140 laterally (arrow B) to at least partially seal the sealing rim 144 of the container 140 against the panel 123. The first engagement member 180a of the container support 130 can engage the second engagement member 180b to prevent or at least restrict vertical motion of the container 140 relative to the housing 110. At this point, the cover 141 can be in surface-to-surface contact or near surface-to-surface contact with the door engaging panel 161 of the container access device 160 to eliminate or reduce the presence of contaminants (such as a volume of gas) between the two surfaces.

The door engaging panel 161 can be secured to the cover 141 by activating the keys 162 (FIG. 5) and the suction cups 164 (FIG. 5). The door engaging panel 161 and the cover 141 can then be withdrawn as a unit into the interior region 124, as indicated by arrow C. In one aspect of this embodiment, the lateral support arm 168 supporting the door engaging panel 161 can have a slot 169. The lateral motion motor 165 can rotate an eccentric pin 170 positioned within the slot 169 (as indicated by arrow "E") to draw the lateral support arm 168 inwardly (arrow C). The lateral support arm 168, the door engaging panel 161, and the cover 141 then move downwardly as a unit, as indicated by arrow D, until the cover 141 and the container access device 160 are beneath the aperture 113.

In one aspect of this embodiment, the container support 130 does not move once the cover 141 has been removed because the engagement members 180 secure the container support 130 to the workpiece loader 120, as described above. In other embodiments, the vertical drive motor 137 (FIG. 2) can be operatively decoupled from the container support 130 when the cover 141 is removed and/or when the container 140 is at height $H_2$. For example, a logic circuit can decouple the vertical drive motor 137, or alternatively, a limit switch can decouple the vertical drive motor 137.

In any of these embodiments, the workpiece transfer device 111 can then move vertically to access each of the microelectronic workpieces 101 within the container 140. For example, the container 140 can have a plurality of workpiece support members 142, each configured to support one of the microelectronic workpieces 101. Each workpiece support member 142 can have two or more circumferentially spaced apart portions that together support the microelectronic workpiece 101. Alternatively, the workpiece support members 142 can have other configurations. For example, each workpiece support member 142 can include a continuous rim or ledge that extends beneath and supports an outer edge of the microelectronic workpiece 101. In any of these embodiments, the workpiece support members 142 can include a lowermost workpiece support member 142a separated from an uppermost workpiece support member 142b by a distance $D_1$. Accordingly, the workpiece transfer device 111 can have an engaging portion 114 that travels a vertical travel distance $D_2$ at least equal to $D_1$ to access any microelectronic workpiece 101 within the container 140 while the container 140 remains stationary. In a particular aspect of this embodiment, the container 140 can be configure to support 25 microelectronic workpieces, and the distance $D_1$ can be about 10.5 inches. In other embodiments, the container 140 can support more or fewer microelectronic workpieces 101 (for example, 13 workpieces) and the distance $D_1$ can have other values.

In any of the foregoing embodiments, the engaging portion 114 can engage the microelectronic workpieces 101 one at a time, or the engaging portion 114 can simultaneously engage more than one microelectronic workpiece 101. Further details of an embodiment of a workpiece transfer device 111 that engages multiple workpieces are disclosed in co-pending U.S. application Ser. No. 60/305,388, filed Jul. 13, 2001; and U.S. application Ser. No. 09/875,300 filed Jun. 5, 2001 and entitled "Transfer Devices for Handling Microelectronic Workpieces Within an Environment of a Processing Machine and Methods of Manufacturing and Using Such Devices in the Processing of Microelectronic Workpieces," both of which are incorporated herein in their entirety by reference.

One feature of the foregoing arrangement is that the container 140 need not move to align each of the microelectronic workpieces 101 with the workpiece transfer device 111 for transfer into and out of the container 140. An advantage of this feature is that the microelectronic workpieces 101 will be less likely to be damaged or misaligned within the container 140. This arrangement can be particularly advantageous when the workpiece biasing device 146 (FIG. 5) is coupled to the cover 141 because the beneficial biasing effect of the biasing device 146 is not available when the cover 141 is removed from the container 140.

In a further aspect of this embodiment, the container access device 160 can include a scanner support 151 supporting a scanner 150. The scanner 150 can emit and receive a detection signal directed toward the edges of the microelectronic workpieces 101 as the container access device 160 moves downwardly (arrow D). The scanner 150 can also detect the presence, absence and/or characteristics of reflections of the signal returned by the edge of the microelectronic workpieces 101. Accordingly, the scanner 150 can determine which of the workpiece support members 142 are occupied, whether more than one microelectronic workpiece 101 is positioned on a given workpiece support member 142, and/or whether or not a microelectronic workpiece 101 is improperly positioned within the container 140 (for example, by being canted or cross-slotted between non-aligned workpiece support members 142).

In one aspect of this embodiment, the scanner 150 can include a model M-DW, device available from Sunx/Ramco Electric Company of West Des Moines, Iowa. Accordingly, the sensor 150 can have a single emitter lens configured to emit a laser beam, and two receiver lenses configured to receive laser light reflected by the microelectronic workpieces 101 in the container 140. In other embodiments, the sensor 150 can emit and detect other types of radiation, for example, visible or non-visible electromagnetic radiation or sonic radiation. In any of these embodiments, the information received by the scanner 150 as it passes adjacent to the microelectronic workpieces 101 can be transmitted to a controller coupled to the workpiece transfer device 111 so that the workpiece transfer device 111 is directed to access only workpiece support members 142 occupied by correctly positioned microelectronic workpieces 101. The scanner 150 can also be coupled to an alerting system to alert an operator if one or more of the microelectronic workpieces 101 are improperly positioned.

In a further aspect of this embodiment, the scanner 150 and the scanner support 151 can be mounted to a portion of the container access device 160 that moves only parallel to the stack of microelectronic workpieces 101 (e.g., vertically), and not toward or away from the microelectronic workpieces 101 (e.g., horizontally). For example, the scanner support 151 can be mounted to the motor support arm 172 rather than the lateral support arm 168 so as to move only upwardly and downwardly relative to the microelectronic workpieces 101, and not toward and away from the microelectronic workpieces 101. Accordingly, this arrangement differs from some conventional arrangements in which the scanner 150 moves both horizontally and vertically relative to the microelectronic workpieces 101.

One feature of an embodiment of the arrangement shown in FIG. 6 is that the motion of the scanner 150 is independent of the horizontal motion of the door engaging panel 161. Accordingly, the door engaging panel 161 can move toward and away from the container 140 without affecting the horizontal position of the scanner 150 relative to the microelectronic workpieces 101. This feature can be particularly advantageous when the scanner 150 emits a light beam having a narrow range of focal lengths. By eliminating the horizontal motion of the scanner 150, the beam emitted by the scanner 150 can be accurately focused at the same location, regardless of where the door engaging panel 161 is positioned. Accordingly, even if the door engaging panel 161 does not consistently retract to the same horizontal location (as indicated by arrow C), this will have no effect on the accuracy of the scanner 150.

Another advantage of this feature is that the mechanism for moving the door engaging panel 161 horizontally can be simplified. For example, the electric lateral motion motor 165 and eccentric pin 170 can be replaced by a simpler pneumatic actuator. The pneumatic actuator may not move the door engaging panel 101 horizontally with the same repeatability or accuracy as the electric motor 165, but such accuracy may be unnecessary because the beam emitted by the scanner 150 can be accurately focused regardless of the horizontal location of the door engaging panel 161.

Another advantage of this arrangement is that the door engaging panel 161 can simultaneously move horizontally and vertically without changing the horizontal separation between the scanner 150 and the microelectronic workpieces 101. Accordingly, the door engaging panel 161 can travel diagonally during one or more phases of its motion, reducing the distance the door engaging panel 161 travels and therefore reducing the time required to move the door engaging panel 161.

Figure 7:
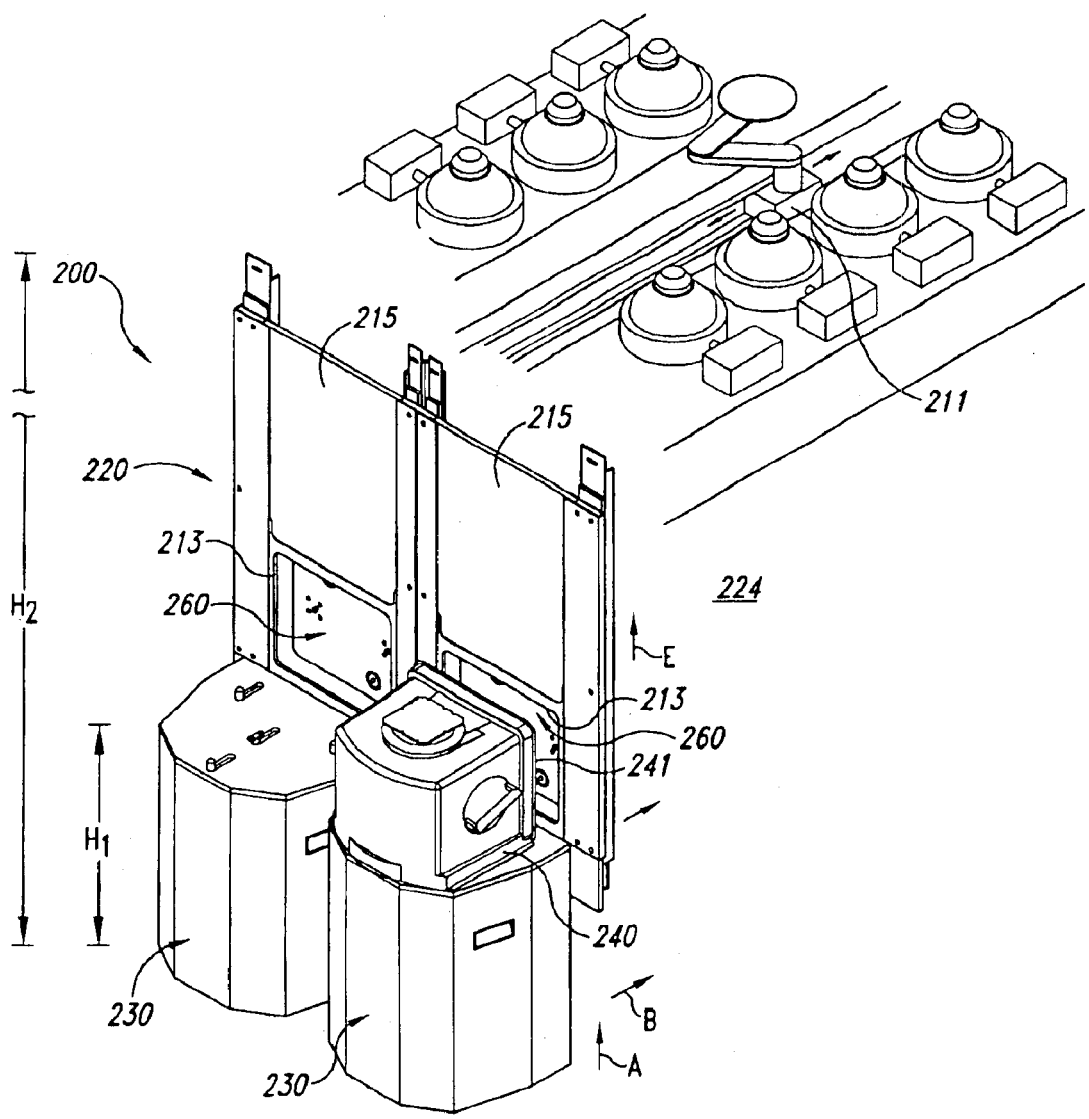
FIG. 7 is a top isometric view of a portion of an apparatus having apertures positioned in a movable receiving portion in accordance with another embodiment of the invention showing selected components schematically.

FIG. 7 illustrates a portion of an apparatus 200 in accordance with another embodiment of the invention. In one aspect of this embodiment, the apparatus 200 can include a workpiece loader 220 having one or more receiving portions or panels 215 (two are shown in FIG. 7). Each receiving portion 215 can have an aperture 213 that allows microelectronic workpieces to be transferred to and from a container 240. Accordingly, the apparatus 200 can include a container support 230 and a container access device 260 positioned proximate to each aperture 213. In a further aspect of this embodiment, the container support 230 can receive the container 240 at an ergonomic height $H_1$, and then at least partially seal the container 240 against the receiving portion 215 by moving the container as indicated by arrow B (and as described above with reference to FIGS. 2–6).

In yet a further aspect of this embodiment, the container access device 260 can engage a cover 241 of the container 240 and withdraw the cover 241 into an interior region 224 of the apparatus 200 while the container 240 remains at height $H_1$. The container support 230 can then move upwardly as indicated by arrow A from height $H_1$ to height $H_2$ and simultaneously, the receiving portion 215 can move upwardly as indicated by arrow E to maintain alignment between the aperture 213 and the container 240. When the container 240 reaches height $H_2$, a workpiece transfer device 211 can access microelectronic workpieces within the container 240. In one aspect of this embodiment, a vertically (but not horizontally) moving portion of the container support 230 can be connected to the receiving portion 215 so that as the container support 230 moves upwardly and downwardly, it also moves the receiving portion 215.

Figure 8:
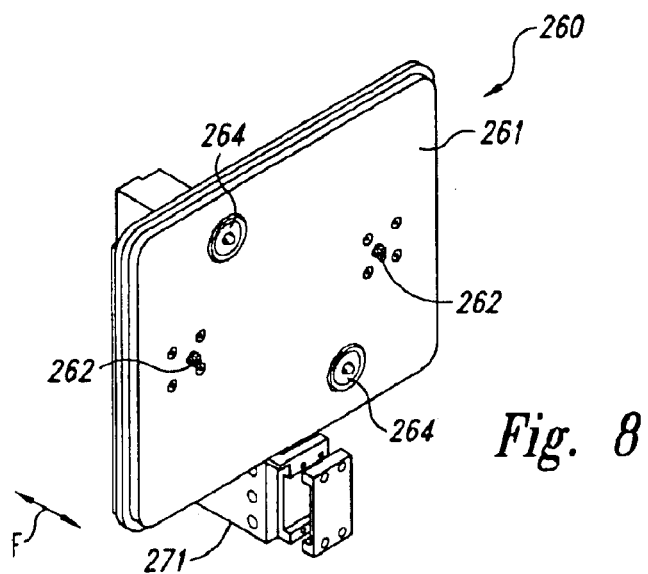
FIG. 8 is an isometric view of a portion of a container access device in accordance with another embodiment of the invention showing selected components schematically.

FIG. 8 illustrates a portion of the container access device 260 described above with reference to FIG. 7. In one aspect of this embodiment, the container access device 260 can include a door engaging panel 261 generally similar to the door engaging panel 161 described above with reference to FIGS. 5 and 6. Accordingly, the door engaging panel 261 can include keys 262 and suction cups 264 to engage the cover 241 of the container 240 (FIG. 7).

The door engaging panel 261 can be coupled to a support 271 that moves along a single axis "F" to withdraw the door engaging panel 261 and the cover 241 from the aperture 213 (FIG. 7). In one aspect of this embodiment, the single axis F can be at least approximately horizontal. In other embodiments, the single axis F can have other orientations. In any of these embodiments, the door engaging panel 261 and the cover 241 need not move away from the container 140 along a second axis (for example, a vertical axis) because instead, the container 240 and the receiving portion 215 move vertically away from the door engaging panel 261 and the cover 241, as described above with reference to FIG. 7. An advantage of this arrangement is that the container access device 260 can be simpler than other access devices, because the door engaging panel 261 need only move along a single axis.

Many or all aspects of the apparatus 200 described above with reference to FIGS. 7 and 8 can be combined with aspects of the apparatus 100 described above with reference to FIGS. 2–6. For example, the container support 230, the container access device 260, and the receiving portion 215 described above with reference to FIGS. 7 and 8 can be positioned adjacent to a housing 110 that supports a workpiece transfer device 111 having a vertical range of motion corresponding to the distance $D_2$ described above with reference to FIG. 6. Accordingly, the container 240 can be immobile once it is positioned at height $H_2$ to reduce the likelihood for disturbing the microelectronic workpieces within the container 240.

Figure 9:
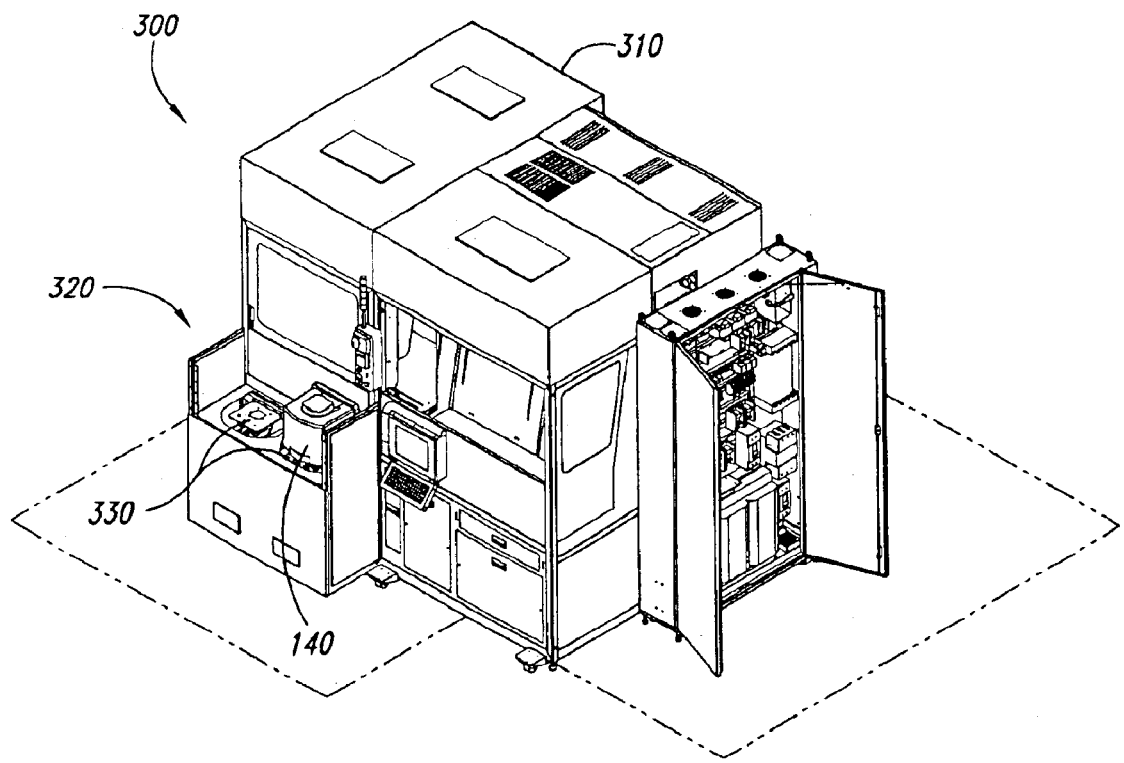
FIG. 9 is an isometric view of an apparatus having a workpiece loader in accordance with another embodiment of the invention showing selected components schematically.

FIG. 9 shows an apparatus 300 in accordance with another embodiment of the invention. In one aspect of this embodiment, the apparatus 300 can include an enclosure 310 for processing microelectronic workpieces. The enclosure 310 can include a workpiece loader 320 having two container supports 330, each configured to receive a workpiece container 140 and bring the workpiece container 140 into the enclosure 310.

Figure 10:
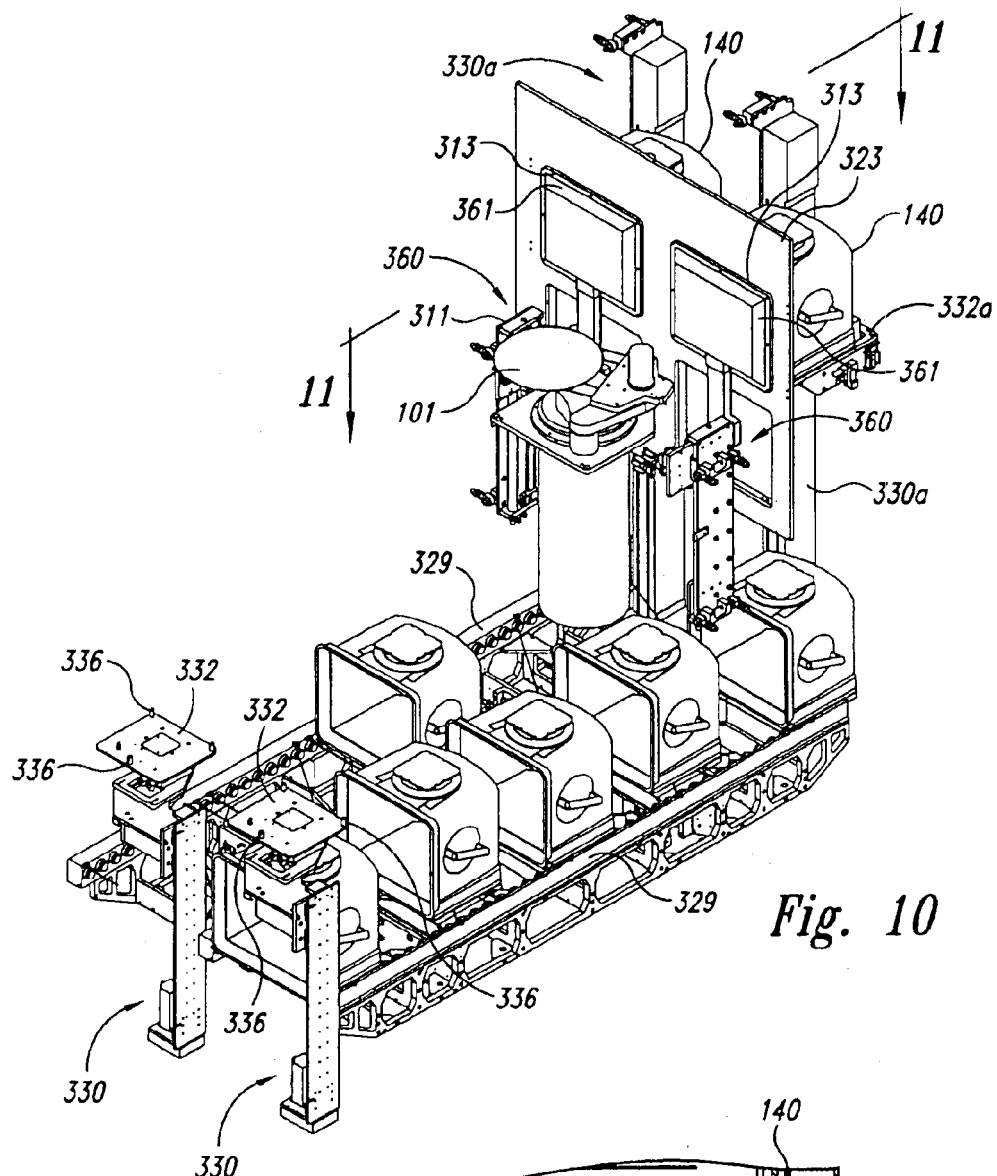
FIG. 10 is an isometric view of a portion of the apparatus shown in FIG. 9, with selected components shown schematically.

FIG. 10 illustrates a portion of the interior of the apparatus 300 described above with reference to FIG. 9. In one aspect of this embodiment, the container supports 330 can each include a support platform 332 having drive pins 336 configured to engage the workpiece containers 140 in a manner generally similar to that described above with reference to FIG. 3. The container supports 330 can be configured to receive the containers 140 at an ergonomic loading height, and then lower the containers 140 to conveyor devices 329. The conveyor devices 329 can be configured to transport the containers 140 inwardly to an interior region of the enclosure 310 (FIG. 9). At the end of each conveyor device 329 is positioned a second container support 330a having a support platform 332a configured to lift the container 140 from the conveyor device 329 and elevate the container 140 to a receiving panel 323. The receiving panel 323 has apertures 313 aligned with each container support 330a. A container access device 360 having a door-engaging panel 361 is aligned with each aperture 313 to remove the cover from the container 140 in a manner generally similar to that described above. A workpiece transfer device 311 then accesses the opened containers 140 to remove the microelectronic workpieces 101 and position them in a transfer container (not shown). The transfer container is then moved to one or more processing stations within the enclosure 310.

Figure 11:
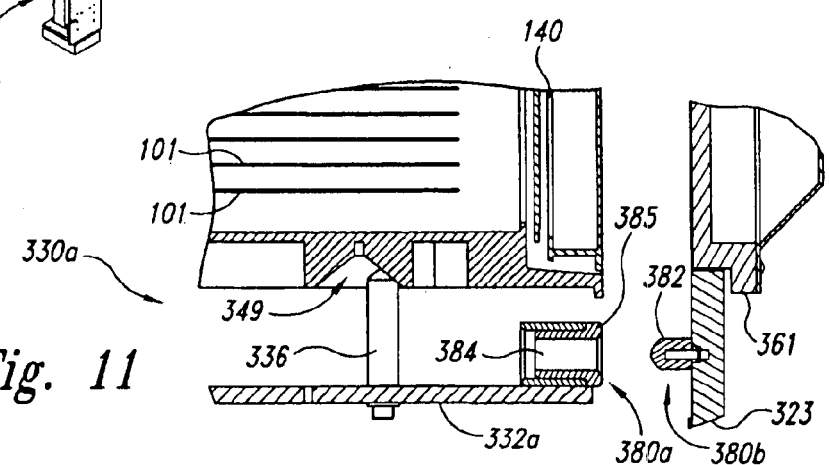
FIG. 11 is a cross-sectional side view of a portion of the apparatus shown in FIG. 10 taken substantially along line 11—11, with selected components shown schematically.

FIG. 11 shows a portion of the panel 323, the container support 330a, and the container 140 taken substantially along line 11—11 of FIG. 10. In one aspect of this embodiment, the container 140 includes tapered apertures 349 that engage the drive pins 336 and center the container 140 on the support platform 332a. The support platform 332a includes a first engagement member 380a that releasably engages a corresponding second engagement member 380b positioned on the panel 323. In one aspect of this embodiment, the first engagement member 380a can include an aperture 384 and the second engagement member 380b an include a pin 382 releasably received in the aperture 384. In a further aspect of this embodiment, the first engagement member 380a can include a face 385 positioned flush with a forward edge of the container 140 and configured to engage the panel 323. Accordingly, the first engagement member 380a and the second engagement member 380b can locate and support the container 140 relative to the panel 323 in a manner generally similar to that described above with reference to FIG. 3.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. An apparatus for handling a microelectronic workpiece initially positioned in a container having a plurality of workpiece support members each configured to support a microelectronic workpiece, the workpiece support members including a first workpiece support member and a second workpiece support member with the second workpiece support member positioned at a distalmost location relative to the first workpiece support member, the apparatus comprising:

a container support positionable proximate to an aperture of an enclosure that at least partially encloses a region for handling a microelectronic workpiece, the container support being configured to support the container;

an actuator coupled to the container support to move the container support along a path between a first position at a first height and a second position at a second height different than the first height; and a workpiece transfer device having an engaging portion configured to releasably engage the microelectronic workpiece, the workpiece transfer device being movable relative to the aperture to move the microelectronic workpiece, the engaging portion having a range of travel that extends from a first position to a second position, and wherein the engaging portion is aligned proximate to the first workpiece support member of the container when the engaging portion is in the first position, the engaging portion being aligned with the second workpiece support member of the container when the engaging portion is in the second position.

2. The apparatus of claim 1 wherein the container has a movable cover and wherein the apparatus further comprises a container access device having a cover engaging portion configured to releasably engage the cover of the container, and wherein the cover engaging portion of the container access device is movable along only a single axis to remove the cover from the container.

3. The apparatus of claim 1, further comprising a receiving portion, with the aperture positioned in the receiving portion, the receiving portion being movable relative to the enclosure between a third position and a fourth position, and wherein the container support is movable with the receiving portion between the third position and the fourth position while an interior region of the container is accessible through the aperture.

4. The apparatus of claim 1 wherein the container includes from eleven to twenty-three workpiece support members along an axis between the first workpiece support member and the second workpiece support member, and wherein the workpiece transfer device has a range of travel in a direction aligned with the axis, the range of travel extending from the first workpiece support member to the second workpiece support member.

5. The apparatus of claim 1 wherein the container has an opening and a cover positioned at least proximate to the opening, the cover being movable between an attached position with the microelectronic workpiece generally inaccessible within the container, and a detached position with the microelectronic workpiece accessible for removal from the container, and wherein the apparatus further comprises a container access device that includes a cover engaging portion positioned to engage the cover, the container access device further including an actuator coupled to the cover engaging portion to move the cover engaging portion and the cover as a unit relative to the container, and wherein the apparatus further comprises a workpiece detector operatively coupled to the movable portion of the container access device to move with the movable portion, the workpiece detector being configured to detect a presence, absence and/or position of a microelectronic workpiece in the container, and wherein the workpiece support members are positioned along a first axis and the workpiece detector is configured to move only along a second axis generally aligned with the first axis.

6. An apparatus for handling microelectronic workpieces initially positioned in a container, the container being changeable from a first configuration with the microelectronic workpieces generally inaccessible within the container to a second configuration with the microelectronic workpieces accessible for removal from the container, the microelectronic workpieces being spaced apart along a first axis, the apparatus comprising:

a container access device positionable proximate to an aperture of an enclosure that at least partially encloses a region for handling a microelectronic workpiece, the container access device having a movable portion movable relative to the aperture along a second axis at least approximately parallel to the first axis to change the configuration of the container from the first configuration to the second configuration; and a workpiece detector operatively coupled to the movable portion of the container access device to move with the movable portion along a third axis at least approximately parallel to the second axis but not toward or away from the second axis, the workpiece detector being configured to detect a presence, absence and/or position of a microelectronic workpiece in the container.

7. The apparatus of claim 6 wherein the container has a removable container cover, the container further having a plurality of workpiece support members aligned along a first axis, with each workpiece support member being configured to support a microelectronic workpiece in a workpiece location, and wherein the movable portion of the container access device is configured to engage the cover, remove the cover from the container, and move the cover along the second axis, and wherein the workpiece detector has an emitter positioned to emit an incident light beam directed toward the workpiece locations, the workpiece detector further having a receiver positioned to receive radiation reflected from microelectronic workpieces at the workpiece locations.

8. The apparatus of claim 6 wherein the workpiece detector is configured to emit an incident beam of radiation and receive a reflected beam of radiation.

9. The apparatus of claim 6 wherein the workpiece detector is configured to emit a laser beam and receive a reflected laser beam.

10. The apparatus of claim 6 further comprising a container support positioned proximate to the aperture and movable relative to the aperture, the container support being configured to support the container in a fixed, stationary position relative to the aperture when the container is in the second configuration and positioned to have the microelectronic workpieces removed.

11. The apparatus of claim 6, further comprising:

a container support positioned proximate to the aperture, the container support being configured to support the container in a stationary position relative to the aperture when the container is in the second configuration and positioned to have the microelectronic workpiece removed;

an actuator coupled to the container support to move the container support between a first position at a first height and a second position at a second height different than the first height;

a first engagement member operatively coupled to the container support; and a second engagement member operatively coupled to the enclosure, the first and second engagement members being engageable with each other to at least restrict vertical motion of the container support when the container is in the second configuration and the container support is in the second position.

12. The apparatus of claim 6 wherein the container has a removable cover and wherein the container access device has a cover engaging portion configured to releasably engage the cover, and further wherein the cover engaging portion is movable in a first direction generally transverse to a plane of the cover and a second direction generally transverse to the first direction to remove the cover from the container.

13. The apparatus of claim 6 wherein the container has a plurality of workpiece support members, each configured to support a microelectronic workpiece, the workpiece support members including a first support member and a second support member with the second support member further than any of the other support members from the first support member, and wherein the apparatus further comprises a workpiece transfer device having an engaging portion configured to releasably engage the microelectronic workpieces, the workpiece transfer device being movable along a fourth axis at least approximately parallel to the first axis to align the engaging portion with a selected one of the microelectronic workpieces, the engaging portion having a range of travel along the fourth axis that extends from a first position aligned proximate to the first support member of the container to a second position aligned proximate to the second support member of the container.

14. An apparatus for handling a microelectronic workpiece initially positioned in a container, the container having an opening with a cover removably positioned adjacent to the opening, the container further having a plurality of workpiece support members aligned along a first axis, with each workpiece support member being configured to support a microelectronic workpiece in a workpiece location, the apparatus comprising:

a container access device positioned proximate to the aperture of an enclosure that at least partially encloses a region for handling a microelectronic workpiece, the container access device having an engaging portion movable along a second axis relative to the aperture to engage the cover and remove the cover from the container, the engaging portion being movable along a third axis transverse to the second axis to move the cover away from the aperture; and a workpiece detector operatively coupled to the container access device to move along only a fourth axis at least approximately parallel to the third axis, but not toward or away from the workpiece locations, the workpiece detector having a radiation emitter positioned to emit an incident light beam directed toward the workpiece locations as the container access device moves along the third axis, the workpiece detector further having a radiation receiver positioned to receive light reflected from microelectronic workpieces at the workpiece locations.

15. The apparatus of claim 14, further comprising a container support positioned proximate to the aperture and movable relative to the aperture, the container support being configured to support the container in a fixed, stationary position relative to the aperture when the container is aligned with the aperture and positioned to have the microelectronic workpiece removed.

16. An apparatus for handling microelectronic workpieces initially positioned in a container, the container being changeable from a first configuration with the microelectronic workpieces generally inaccessible within the container to a second configuration with the microelectronic workpieces accessible for removal from the container, the microelectronic workpieces being spaced apart along a first axis, the apparatus comprising:

a container access device positionable proximate to an aperture of an enclosure that at least partially encloses a region for handling a microelectronic workpiece, the container access device having a movable portion movable relative to the aperture to change the configuration of the container from the first configuration to the second configuration, the container access device further having a guide structure aligned along a second axis at least approximately parallel to the first axis, the movable portion being coupled to the guide structure to move along the second axis, the guide structure at least restricting motion of the movable portion away from the second axis; and a workpiece detector coupled to the movable portion of the container access device to move along a third axis at least approximately parallel to the second axis, the guide structure at least restricting motion of the workpiece detector away from the third axis, the workpiece detector being configured to detect a presence, absence and/or position of a microelectronic workpiece on the container.

17. The apparatus at claim 16, further comprising a container support positioned proximate to the aperture and movable relative to the aperture, the container support being configured to support the container in a fixed, stationary position relative to the aperture when the container is in the second configuration and positioned to have the microelectronic workpieces removed.

18. A method for handling microelectronic workpieces, comprising:

positioning a container proximate to an aperture least partially enclosing a region for handling a microelectronic workpiece, the container having a plurality of microelectronic workpieces spaced apart along a first axis;

changing a configuration of the container from a first configuration with the microelectronic workpieces generally inaccessible within the container to a second configuration with the microelectronic workpieces accessible for removal from the container by engaging a container access device with the container and moving a movable portion of the container access device along a second axis at least approximately parallel to the first axis; and detecting a presence, absence, and/or position of a microelectronic workpiece in the container by moving a workpiece detector together with the movable portion of the container access device as the movable portion moves along the second axis and without moving the workpiece detector toward or away from the first axis.

19. The method of claim 18 wherein the container has a removable cover and wherein changing a configuration of the container includes removing the cover from the container.

20. The method of claim 18 wherein detecting a presence, absence, and/or position of a microelectronic workpiece includes directing a light beam toward the microelectronic workpiece and receiving the light beam reflected from the microelectronic workpiece.

21. The method of claim 18, further comprising:

elevating the container from a first position to a second position above the first position;

releasably securing the container at the second position; and removing a microelectronic workpiece from the container while the container remains fixed at the second position.

22. The method of claim 18 wherein the plurality of microelectronic workpieces includes a first microelectronic workpiece and a second microelectronic workpiece with the second microelectronic workpiece positioned further than all the other microelectronic workpieces from the first microelectronic workpieces, and wherein the method further comprises:

aligning a workpiece transfer device with the first microelectronic workpiece;

removing the first microelectronic workpiece from the container by engaging the workpiece transfer device with the first microelectronic workpiece;

moving the workpiece transfer device to align the workpiece transfer device with the second microelectronic workpiece while the container remains in a fixed position relative to the enclosure; and removing the second microelectronic workpiece from the container by engaging the workpiece transfer device with the second microelectronic workpiece.

23. The apparatus of claim 1 wherein at least a portion of the workpiece transfer device is movable relative to the aperture in a generally vertical direction.

24. The apparatus of claim 1 wherein the workpiece transfer device is movable relative to the aperture along two generally orthogonal axes.

* * * * *